United States Patent
Sun et al.

(10) Patent No.: US 7,525,862 B1
(45) Date of Patent: Apr. 28, 2009

(54) METHODS INVOLVING RESETTING SPIN-TORQUE MAGNETIC RANDOM ACCESS MEMORY WITH DOMAIN WALL

(75) Inventors: Jonathan Z. Sun, Shrub Oak, NY (US); Rudolf M. Tromp, North Salem, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/118,499

(22) Filed: May 9, 2008

(51) Int. Cl.
*G11C 11/14* (2006.01)
*G11C 11/15* (2006.01)
*G11C 11/16* (2006.01)

(52) U.S. Cl. .............. 365/225.5; 365/158; 365/171; 365/173; 365/189.16; 365/243.5

(58) Field of Classification Search .......... 365/158, 365/171, 173, 189.16, 225.5, 243.5, 80, 83, 365/85, 87; 257/414, 421; 360/314, 316, 360/324, 324.1
See application file for complete search history.

(56) References Cited

U.S. PATENT DOCUMENTS

| | | | | |
|---|---|---|---|---|
| 3,493,940 | A | * | 2/1970 | Shafer .................. 365/55 |
| 3,534,340 | A | * | 10/1970 | Tracy et al. .............. 365/171 |
| 3,670,312 | A | * | 6/1972 | Broadbent .............. 365/86 |
| 2004/0252539 | A1 | * | 12/2004 | Parkin .................. 365/80 |
| 2006/0221677 | A1 | * | 10/2006 | Klaeui et al. ............ 365/158 |
| 2006/0237808 | A1 | | 10/2006 | Saito |

OTHER PUBLICATIONS

Numata et al. "Scalable Cell Technology Utilizing Domain Wall Motion for High-speed MRAM" 2007 Symposium on VLSI Technology Digest of Technical Papers, pp. 232-233.*

* cited by examiner

*Primary Examiner*—J. H. Hur
(74) *Attorney, Agent, or Firm*—Cantor Colburn LLP; Vazken Alexanian

(57) ABSTRACT

A method for resetting a spin-transfer based random access memory system, the method comprising, inducing a first current through a first conductor, wherein the first current is operative to propagate a magnetic domain wall in a ferromagnetic film layer and the propagation of the magnetic domain wall is further operative to change the direction of a magnetic state of a first free layer magnet, and inducing a second current only through a second conductor, wherein the second current is operative to further propagate the magnetic domain wall in the ferromagnetic film layer and the propagation of the magnetic domain wall is further operative to change the direction of a magnetic state of a second free layer magnet.

2 Claims, 8 Drawing Sheets

METHODS INVOLVING RESETTING SPIN-TORQUE MAGNETIC RANDOM ACCESS MEMORY WITH DOMAIN WALL

The present application is co-pending with the concurrently filed applications, entitled "SYSTEMS INVOLVING SPIN-TRANSFER MAGNETIC RANDOM ACCESS MEMORY," and "METHODS INVOLVING RESETTING SPIN-TORQUE MAGNETIC RANDOM ACCESS MEMORY" assigned to the assignee of the present application, the contents of which are incorporated herein by reference in their entirety.

BACKGROUND OF THE INVENTION

1. Field of the Invention

This invention relates generally to magnetic random access memory and specifically to methods involving resetting spin-torque based magnetic random access memory.

2. Description of Background

A dense, diode-selection based memory architecture has recently been demonstrated for a two-terminal memory device based on phase change materials. However, since spin-RAM usually uses bidirectional current for writing the 0 and 1 states, a dense, diode selection-based memory architecture is difficult to implement with spin-RAM since diodes may limit the use of bidirectional current.

A method for resetting a spin-RAM that uses bidirectional current is desired.

SUMMARY OF THE INVENTION

The shortcomings of the prior art are overcome and additional advantages are achieved through an exemplary method for resetting a spin-transfer based random access memory system, the method comprising, inducing a first current through a first conductor, wherein the first current is operative to propagate a magnetic domain wall in a ferromagnetic film layer and the propagation of the magnetic domain wall is further operative to change the direction of a magnetic state of a first free layer magnet, and inducing a second current through a second conductor, wherein the second current is operative to further propagate the magnetic domain wall in the ferromagnetic film layer and the propagation of the magnetic domain wall is further operative to change the direction of a magnetic state of a second free layer magnet.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Methods involving resetting spin-torque based magnetic write random access memory are provided. Several exemplary embodiments are described.

The embodiments of a spin-torque based magnetic write random access memory allow for more robust operation of the memory device with existing materials combination. It further enables the implementation of a high-density version of spin-RAM, based on diode-selection that makes spin-RAM more economical to produce. This improves cost-to-performance characteristics, while retaining the basic advantages of a spin-torque-based RAM.

Figure 2:
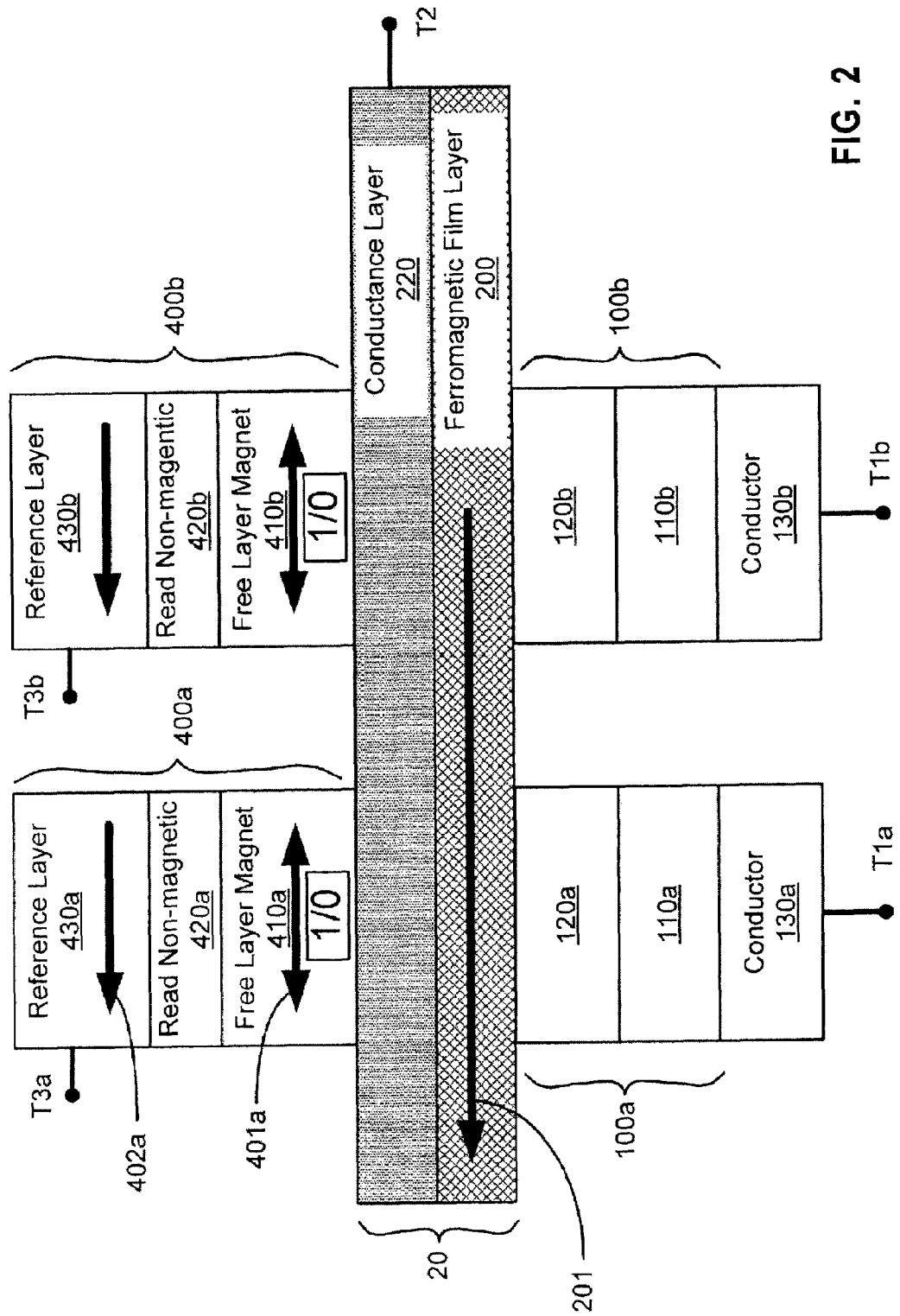
FIG. 2 illustrates a front partially cut-away view of an example of an embodiment of a spin-torque based magnetic write random access memory system.

FIG. 2 illustrates a front partially cut-away view of a three-terminal spin-torque based magnetic write random access memory containing three electrical connections, T1$a$, T2, and T3$a$ terminals. In the illustrated embodiment, a write portion 100$a$ is a pillar-shaped non-linear selection device, such as, for example, P/N junction that includes a p-type doped region 110$a$ and an n-type doped region 120$a$ (or in reverse order, depending on the direction of write current for the design). The n-type doped region 120$a$ electrically contacts a ferromagnetic film layer 200. The p-type doped region 110$a$ electrically contacts a conductor 130$a$ that is connected to the T1$a$ terminal. Though the illustrated embodiment shows a P/N junction, any suitable non-linear selection device may be used for the write portion 100$a$.

A spin-current generating portion 20 includes the ferromagnetic film layer 200, and a conductance layer 220. The ferromagnetic film layer 200 is a magnetic, spin-polarizing layer. The conductance layer 220 is a non-magnetic, spin preserving, high conductance layer such as, for example, copper. A tunnel layer (not shown) may be used to separate the ferromagnetic film layer 200 and the conductance layer 220. Depending on the specifics of materials properties, the tunnel layer may not be necessary. In some materials combinations, it is possible to allow a direct, high quality interface (usually formed during thin film deposition) between the ferromagnetic film layer 200 and the conductance layer 220. The conductance layer 220 electrically contacts the T2 terminal.

A read portion 400$a$ forms the magnetic state detection device group. The read portion 400$a$ is a pillar shape on the conductance layer 220. The read portion 400$a$ includes a free layer magnet 410$a$ disposed on the conductance layer 220, a read non-magnetic layer 420$a$, and a reference layer 430$a$. The read non-magnetic layer 420$a$ is a non-magnetic spin-preserving metallic separation layer that may be, for example, a tunnel barrier layer. The reference layer 430$a$ electrically contacts the T3$a$ terminal. The read portion 400$a$ is disposed on the conductance layer 220$a$ with a high quality interface, usually formed during film growth, to allow efficient interaction between the free layer magnet 410$a$ and a spin-current (not shown).

Figure 3:
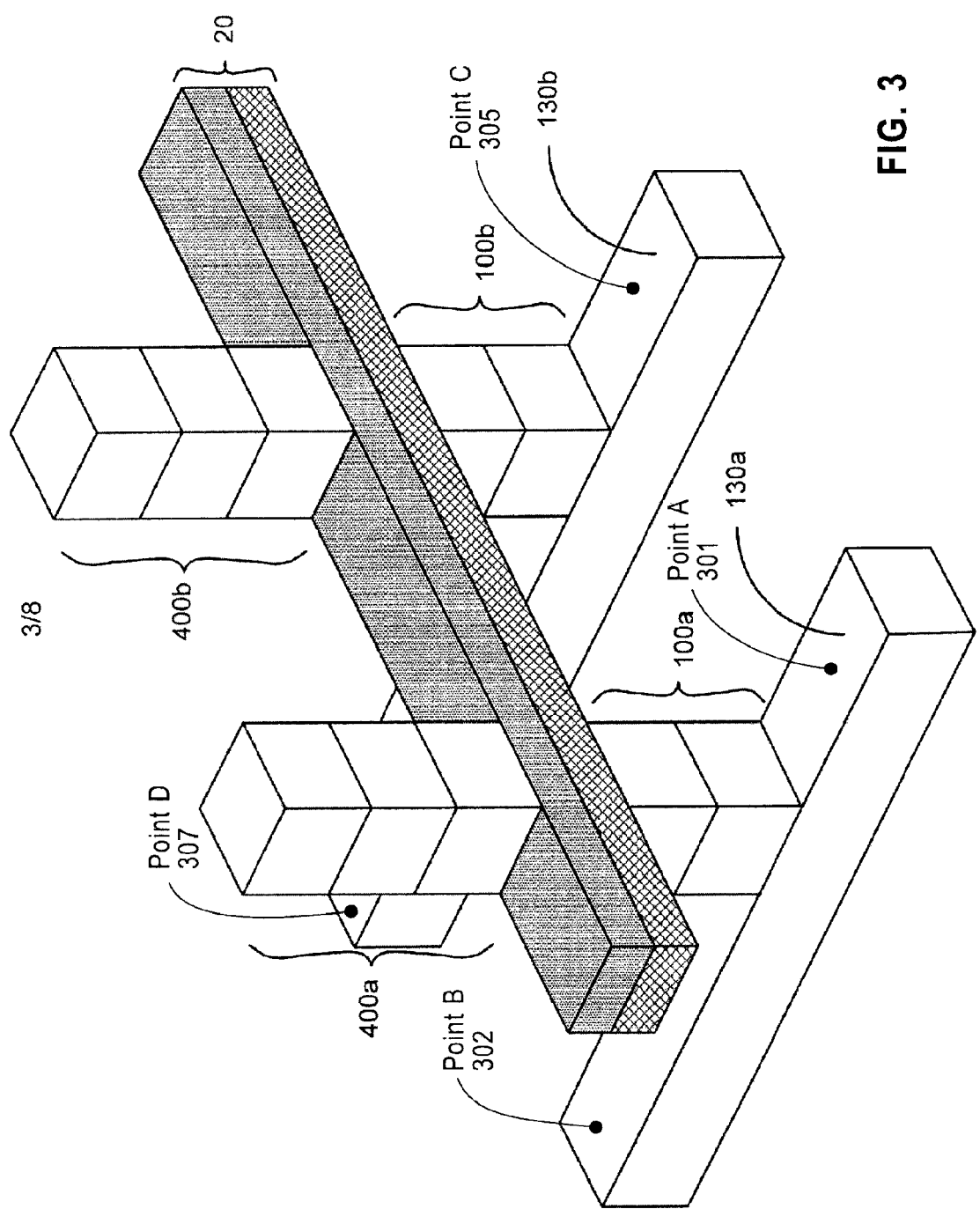
FIG. 3 illustrates a perspective view the example of the embodiment of the spin-torque based magnetic write random access memory system of FIG. 2.

The reference layer 430$a$ is magnetically fixed. A direction of magnetization of the reference layer 430$a$ is permanently fixed in the direction indicated by the arrow 402$a$. In the illustrated embodiment, the arrow 402a points to the left, however, the arrow 402a may point to the right in other embodiments. The free layer magnet 410a is a nanomagnet having a magnetic state illustrated by the arrow 401a. The free layer magnet 410a serves as a memory element, and the direction of the arrow 401a (right or left) indicates two bi-stable memory states of the free layer magnet 410a. FIG. 2 also includes a second read portion 400b and a second write portion 100b that are similar to the read portion 400a and write portion 100a. FIG. 3 illustrates a perspective view of the three-terminal spin-torque based magnetic write random access memory of FIG. 2 including a point A 301 and a point B 303 on the conductor 130a, and a point C 305 and a point D 307 on the conductor 130b.

Figure 1:
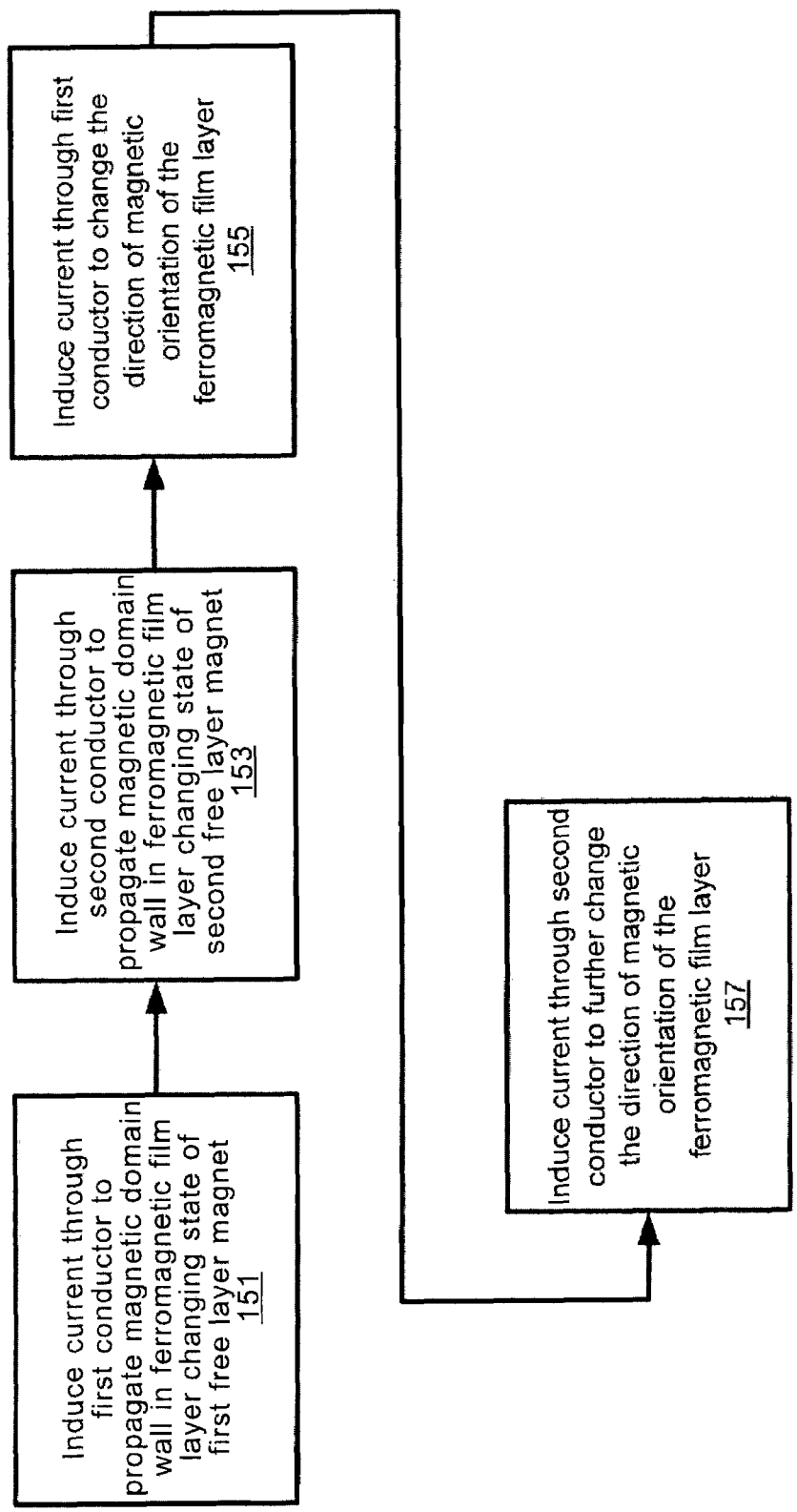
FIG. 1 illustrates a block diagram of an exemplary method for resetting a three terminal spin-RAM device with a domain wall.

FIG. 1 illustrates a block diagram of an exemplary method of resetting a spin-torque-based RAM. Referring to block 151, a first current is induced through a first conductor to create and propagate a magnetic domain wall in a ferromagnetic film layer, changing the state of a first free layer magnet. In block 153, a second current is induced through a second conductor to further propagate the magnetic domain wall in the ferromagnetic film layer, changing the state of a second free layer magnet. In block 155, a third current is induced through the first conductor to change the direction of magnetic orientation of the ferromagnetic film layer. In block 157, a fourth current is induced through the second conductor to further change the direction of magnetic orientation of the ferromagnetic film layer. The method illustrated in FIG. 1 is shown in detail in FIGS. 4-8.

Figure 4:
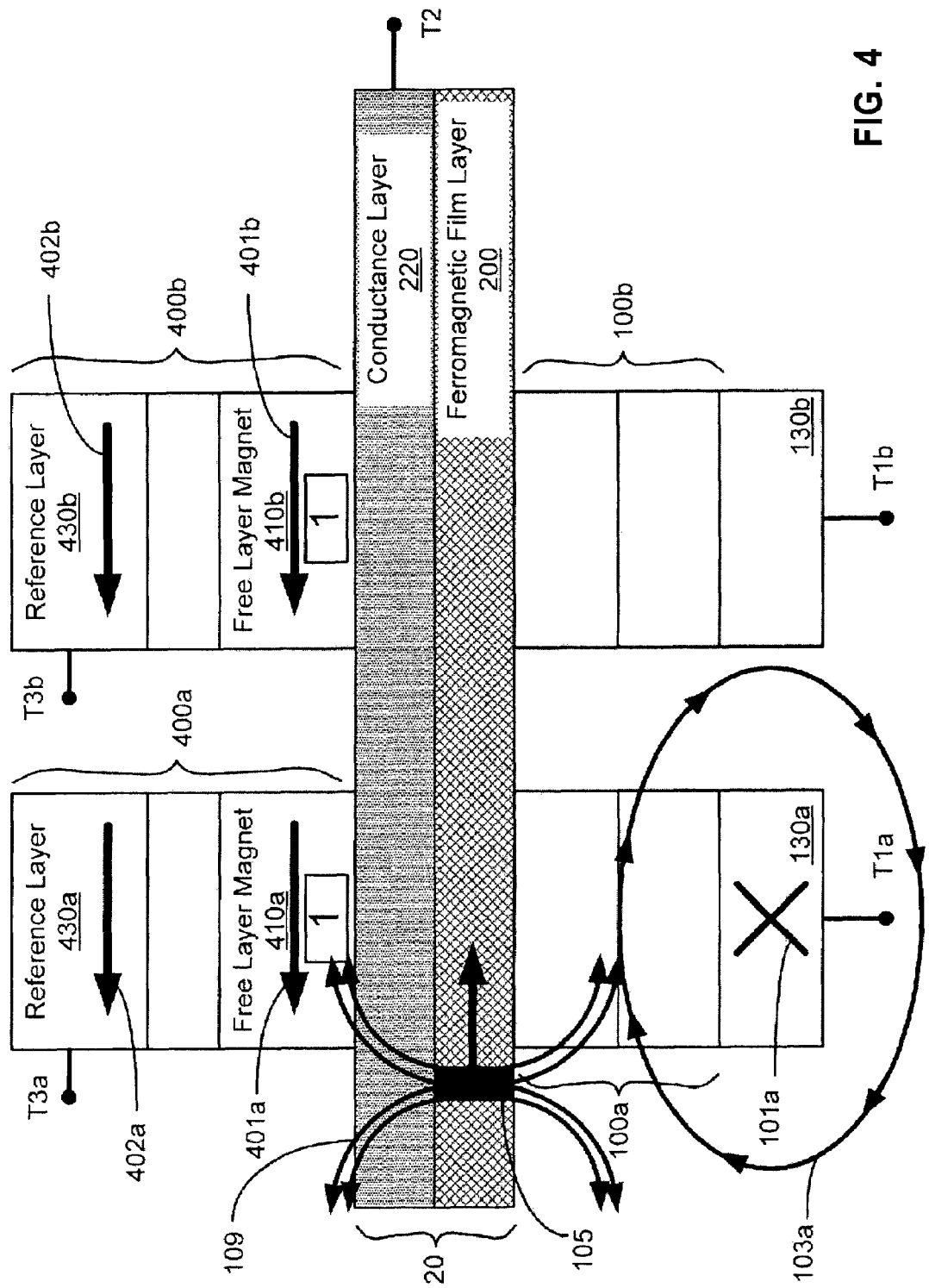
FIGS. 4-8 illustrate a side-view of an example of an embodiment of a spin-torque based magnetic write random access memory system and the method described in FIG. 1.

FIG. 4 shows an embodiment of a spin-torque-based RAM similar to the embodiment of FIG. 2. In FIG. 4, the magnetization of the reference layers 430a and 430b are fixed in the direction indicated by the arrows 402a and 402b. The magnetic orientation of the free layer magnets 410a and 410b, memory elements, are shown by of the arrows 401a and 401b. In the illustrated embodiment the arrows 401a and 401b point to the left, representing 1 bits.

Resetting the spin-torque-based RAM is accomplished by changing the free layer magnets 410a and 410b from representing 1 bits to 0 bits. To change the free layer magnets 410a and 410b from representing 1 bits to 0 bits, a magnetic domain wall is created and propagated through the ferromagnetic film layer 200. FIG. 4 illustrates a method of creating a magnetic domain wall in the ferromagnetic film layer 200. As illustrated in block 151 (of FIG. 1), a first current 101a is induced along the conductor 130a through the point A 301 and the point B 303 (shown in FIG. 3). The conductor 130a is orientated at a right angle to the ferromagnetic film layer 200. The first current 101a creates a magnetic flux 103a that is effective create a magnetic domain wall 105. The magnetic domain wall 105 has a magnetic flux 109.

Figure 5:
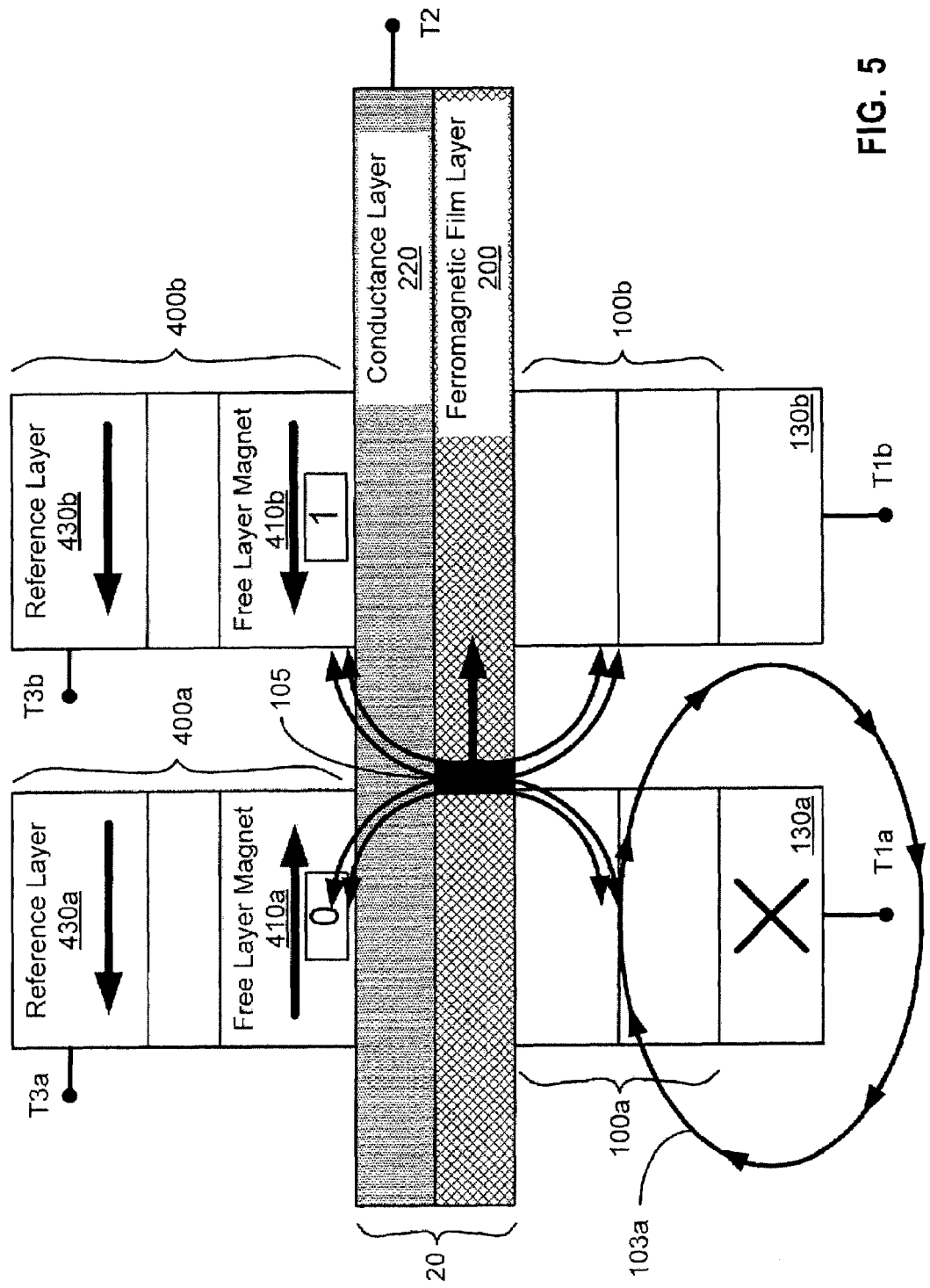

Referring to FIG. 5, once the magnetic domain wall 105 is created, the first current 101a causes the magnetic domain wall 105 to propagate through the ferromagnetic layer 200 in the right direction. The propagation of the magnetic domain wall 105 and the magnetic flux 109 causes the magnetic orientation of the free layer magnet 410a to be changed from representing a 1 bit to a 0 bit.

Figure 6:
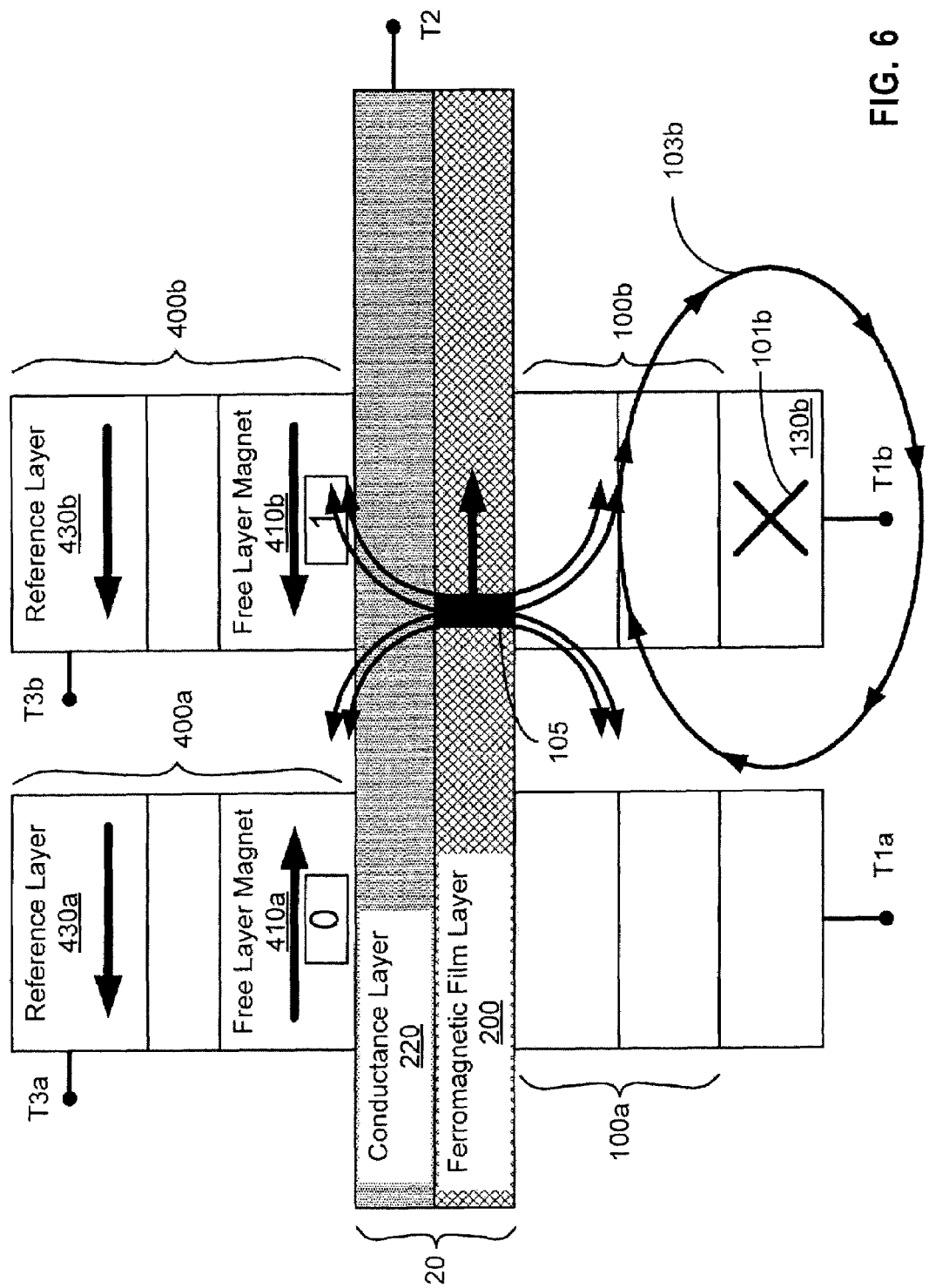
Figure 7:
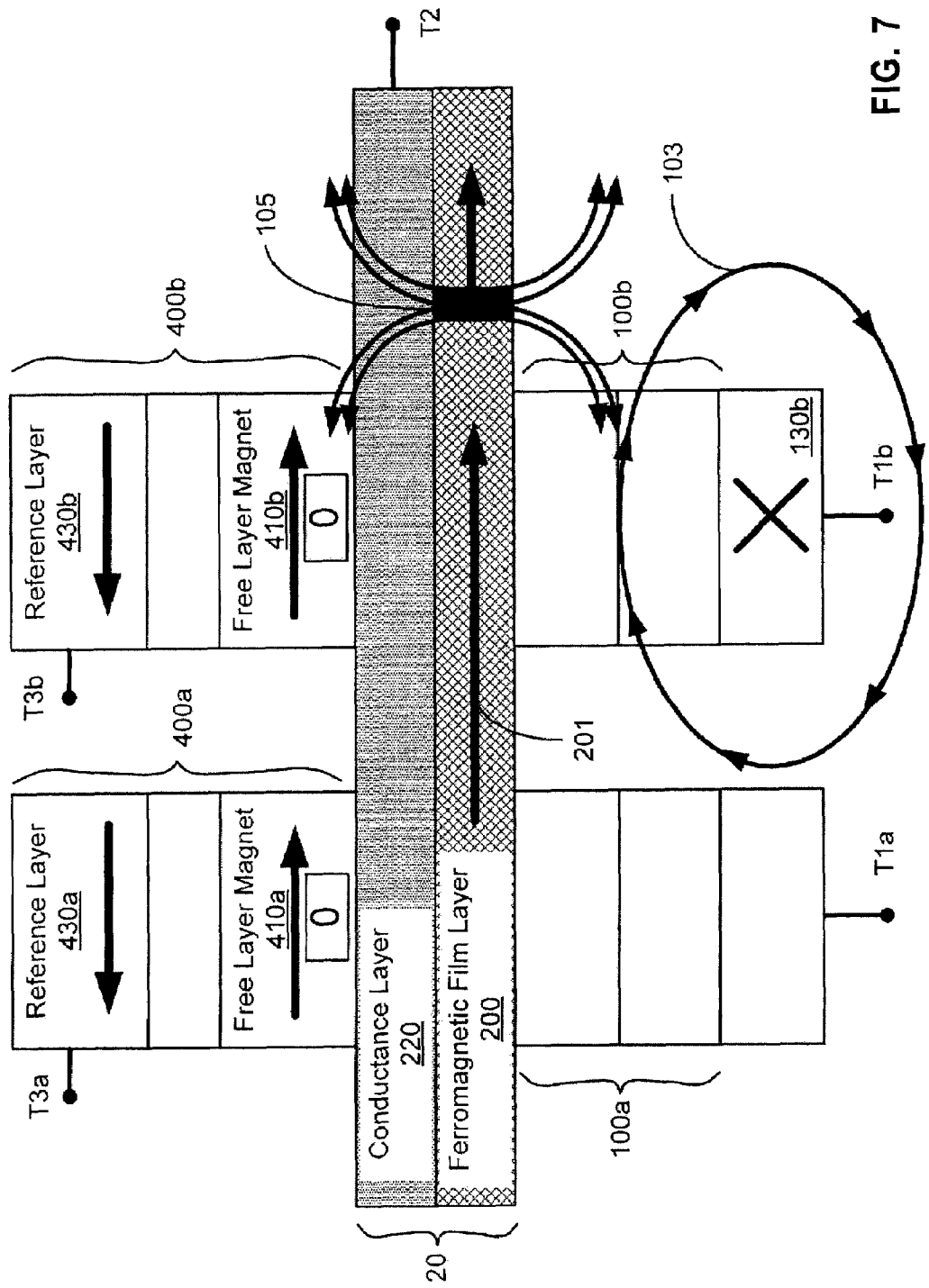

As illustrated in block 153 (of FIG. 1) and shown in FIG. 6, a second current 101b is induced along the conductor 130b through the point C 305 and the point D 307 (shown in FIG. 3). The second current 101b results in a magnetic flux 103b and the further propagation of the magnetic domain wall 105 along the ferromagnetic film layer 200. In FIG. 7 the second current 101b has caused the magnetic domain wall 105 to propagate along the ferromagnetic film layer 200 and past the free layer magnet 410b. The magnetic orientation of the free layer magnet now represents a 0 bit.

Figure 8:
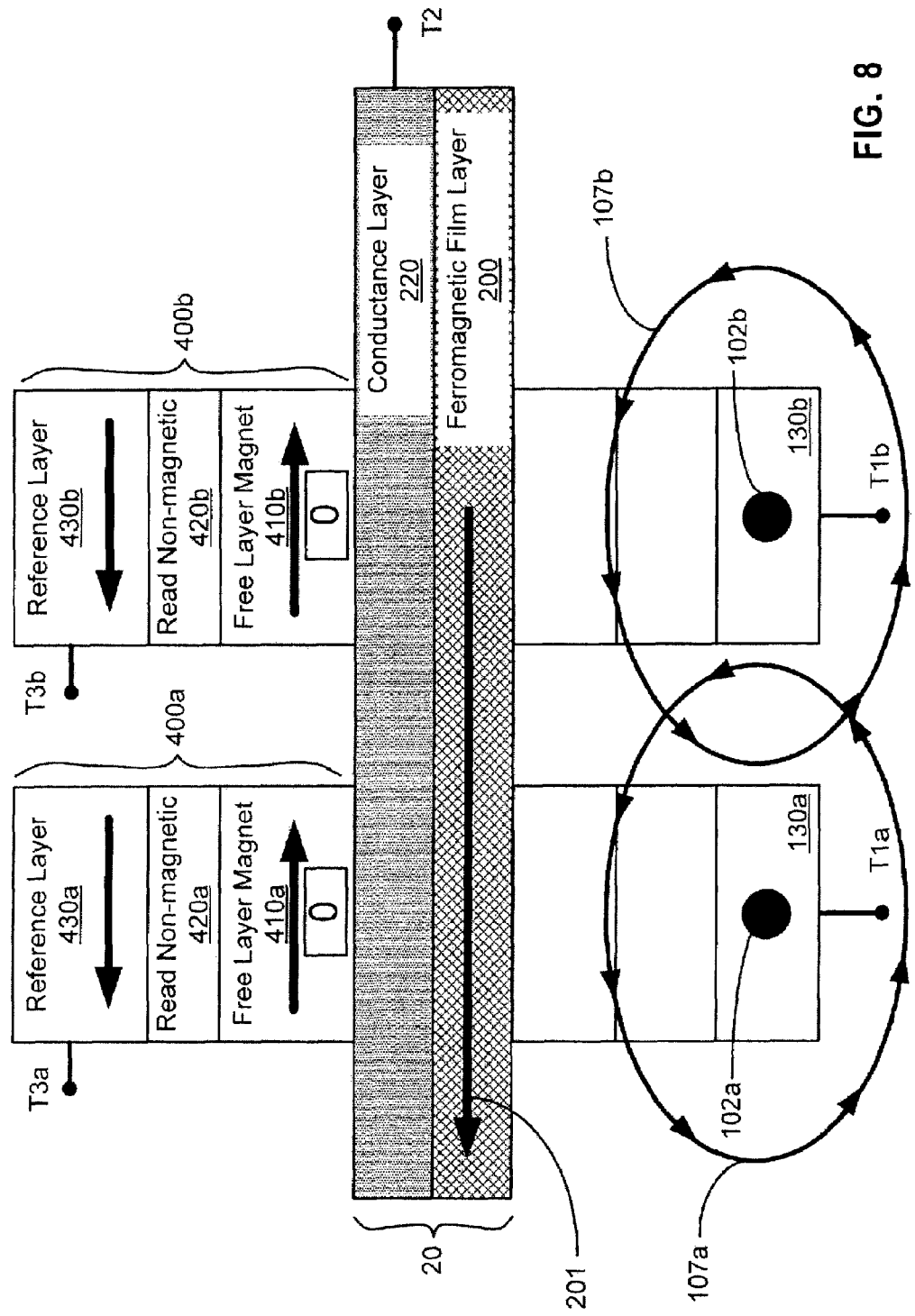

FIG. 8 illustrates blocks 155 and 157 (of FIG. 1). After the direction of the magnetic state of the free layer magnets 410a and 410b are changed, the direction of the magnetic orientation of the ferromagnetic film layer 200 may be returned to the first direction shown in FIG. 2 by arrow 201. A fourth current 102a and a fifth current 102b are induced along the conductors 130a and 130b in a direction opposite to the first current 101a and the second current 101b. The fourth current 102a and the fifth current 102b create magnetic flux 107a and 107b that are effective to change the direction of the magnetic orientation of the ferromagnetic film layer 200 to an opposite direction as indicated by the arrow 201. The fourth current 102a and the fifth current 102b may be induced at the same time or in a sequence to change the direction of the magnetic orientation of the ferromagnetic film layer 200. The methods described above may be used to reset the memories of embodiments having any additional number of read portions and write portions similar to read portion 400 and write portion 100.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for resetting a spin-transfer based random access memory system, the method comprising:
    inducing a first current through a first conductor, wherein the first current is operative to propagate a magnetic domain wall in a ferromagnetic film layer and the propagation of the magnetic domain wall is further operative to change the direction of a magnetic state of a first free layer magnet; and
    inducing a second current through a second conductor, wherein the second current is operative to further propagate the magnetic domain wall in the ferromagnetic film layer and the propagation of the magnetic domain wall is further operative to change the direction of a magnetic state of a second free layer magnet.

2. The method of claim 1, the method further comprising:
    inducing a third current through the first conductor, wherein the third current is operative to change the direction of a magnetic state of the ferromagnetic film layer; and
    inducing a fourth current through the second conductor, wherein the fourth current is further operative to change the direction of a magnetic state of the magnetic reference layer.

* * * * *